United States Patent

Nakaguma et al.

[11] Patent Number: 5,210,055
[45] Date of Patent: May 11, 1993

[54] METHOD FOR THE PLASMA TREATMENT OF SEMICONDUCTOR DEVICES

[75] Inventors: Shinji Nakaguma; Toshinobu Banjyo, both of Fukuoka, Japan

[73] Assignee: Mitsubishi Denki Kabushiki Kaisha, Tokyo, Japan

[21] Appl. No.: 601,914

[22] Filed: Oct. 17, 1990

[30] Foreign Application Priority Data

May 18, 1990 [JP] Japan .................... 2-126982

[51] Int. Cl.$^5$ ............... H01L 21/00; H01L 21/02; H01L 21/302
[52] U.S. Cl. ................... 437/225; 437/228; 427/569; 118/501; 118/620
[58] Field of Search ............ 427/38, 39; 118/718, 118/715, 620, 50.1, 50; 437/225, 228

[56] References Cited

U.S. PATENT DOCUMENTS

| | | | |
|---|---|---|---|
| 4,479,455 | 10/1984 | Doehler et al. | 118/718 |
| 4,511,593 | 4/1985 | Brandolf | 427/37 |
| 4,512,283 | 4/1985 | Bonifield et al. | 118/723 |
| 4,626,447 | 12/1986 | Doehler et al. | 427/39 |

FOREIGN PATENT DOCUMENTS

| | | |
|---|---|---|
| 0115970 | 6/1988 | EPO . |
| 3606959 | 9/1987 | Fed. Rep. of Germany . |
| 0213427 | 12/1983 | Japan . |

Primary Examiner—Brian E. Hearn
Assistant Examiner—B. Everhart
Attorney, Agent, or Firm—Leydig, Voit & Mayer

[57] ABSTRACT

In an apparatus for the plasma treatment of semiconductor devices, a cover is provided on the outer periphery of the space between the upper and lower electrodes. By virtue of the provision of the cover on the outer periphery of the inter-electrode space, the processing gas ejected from ejection holes on one surface of the upper electrode diffuses evenly in the inter-electrode space to reach the surface of the semiconductor wafer. Therefore, it is possible to improve the efficiency at which the wafer is processed as well as the evenness with which various portions of the surface of the wafer are treated.

1 Claim, 3 Drawing Sheets

F I G. 2
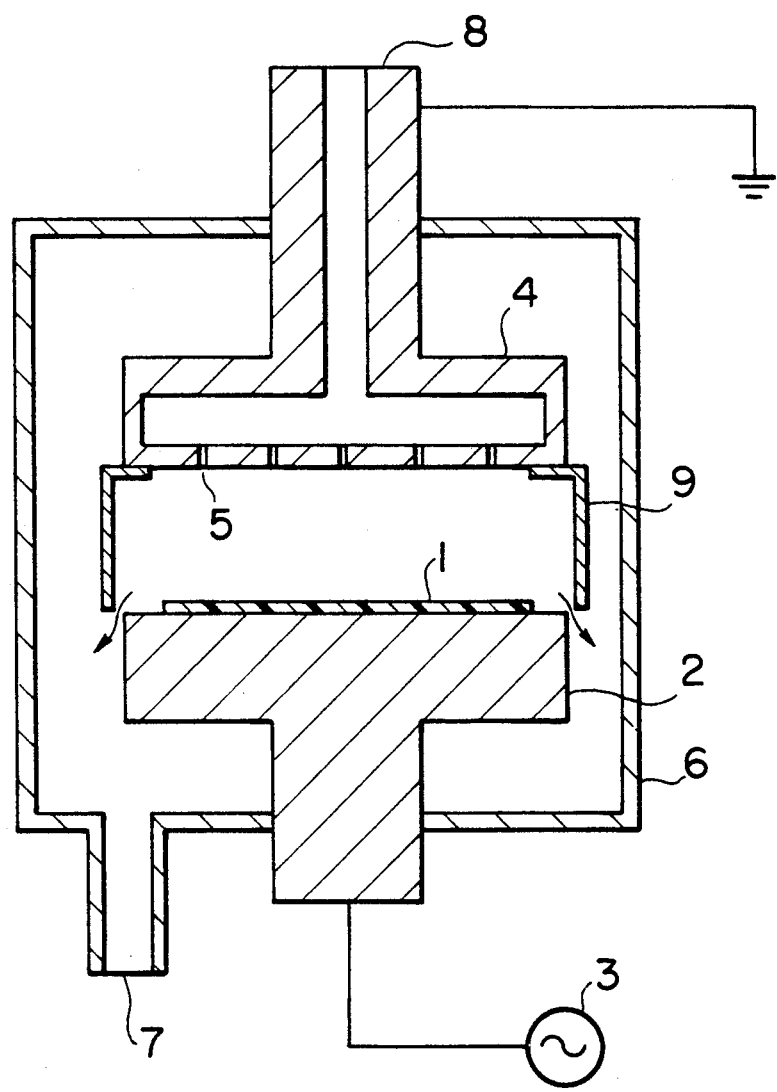

METHOD FOR THE PLASMA TREATMENT OF SEMICONDUCTOR DEVICES

BACKGROUND OF THE INVENTION

1. Field of the Invention

The present invention relates to an apparatus and a method for subjecting semiconductor devices to plasma treatment and, more specifically, to such an apparatus and a method used to subject semiconductor devices to plasma treatment in various processes during manufacture of the devices.

2. Description of the Related Art

FIG. 1 schematically shows a section of a conventional plasma treatment apparatus of the parallel plate type. As shown in the drawing, a semiconductor wafer 1 is placed on a lower electrode 2 to which a high-frequency voltage is applied by a high-frequency source 3. At a position above the lower electrode 2, an upper electrode 4 is disposed in parallel opposition to the lower electrode 2. The upper electrode 4 is grounded. A plurality of gas ejection holes 5 open on the lower surface of the upper electrode 4 in order to eject a processing gas into the space between the upper and lower electrodes 4 and 2 and to cause the ejected gas to diffuse in the space. The lower and upper electrodes 2 and 4 and other associated component parts are accommodated in a vacuum vessel 6.

The conventional apparatus for the plasma treatment of semiconductor devices, which has the above-described basic construction, operates in the following manner. A semiconductor wafer 1 is placed on the lower electrode 2. The interior of the vacuum vessel 6 is evacuated through an evacuation port 7 which is provided as an evacuation means on the vacuum vessel 6. When the interior of the vacuum vessel 6 has reached a predetermined degree of vacuum, processing gas is introduced through a gas introduction port 8 provided at an upper position of the upper electrode 4. The processing gas is ejected from the gas ejection holes 5 opening on the lower surface at the bottom of the upper electrode 4, and diffuses in the space between the upper and lower electrodes 4 and 2. Subsequently, a high-frequency voltage is applied to the lower electrode 2 by the high-frequency source 3, thereby generating a plasma in the space between the lower and upper electrodes 2 and 4, so that the semiconductor wafer 1 is treated with the plasma. A semiconductor device is subjected to plasma treatment during such processes as etching and ashing.

The above-described conventional plasma treatment apparatus entails the following problems. The processing gas ejected from the gas ejection holes 5 opening on the lower surface at the bottom of the upper electrode 4 diffuses in the space between the upper and lower electrodes 4 and 2, and a part of the gas diffuses outward from the space and is finally discharged through the evacuation port 7. Consequently, the amount of the gas which reaches the surface of the semiconductor wafer 1 is relatively small for the entire amount of the processing gas actually introduced through the gas introduction port 8. Thus, the semiconductor wafer 1 is processed with low efficiency. Another problem is that, since a part of the ejected processing gas diffuses outside of the space between the upper and lower electrodes 4 and 2, the gas on the surface of the semiconductor wafer 1 is unevenly distributed. This results in decreased processing efficiency and uneven treatment of various portions of the surface of the semiconductor wafer 1.

SUMMARY OF THE INVENTION

The present invention has been accomplished to overcome the above-described problems. It is an object of the present invention to provide an apparatus and a method for the plasma treatment of semiconductor devices that improve the degree to which processing gas reaches the surface of a semiconductor wafer, thereby improving the efficiency with which the semiconductor wafer is processed, and also achieve even diffusion of processing gas between two electrodes, thereby improving the evenness with which various portions of the surface of the semiconductor wafer are treated.

According to one aspect of the present invention, there is provided an apparatus for the plasma treatment of semiconductor devices comprising: a vacuum vessel; a lower electrode provided within the vacuum vessel, the electrode allowing a semiconductor wafer to be placed thereon; an upper electrode provided at an upper position of the vacuum vessel and disposed in parallel opposition to the lower electrode; a plurality of gas ejection holes formed on the lower surface of the upper electrode for ejecting processing gas toward the semiconductor wafer; a cover at the periphery of the upper and lower electrodes to increase the proportion of the processing gas ejected from the gas injection holes that reaches the semiconductor wafer; a high-frequency source for applying a high-frequency voltage to the upper and lower electrodes to generate a plasma; and an evacuation means for evacuating gas from within the vacuum vessel.

According to another aspect of the present invention, there is provided a method for the plasma treatment of semiconductor devices comprising the steps of: placing a semiconductor wafer on a lower electrode provided within a vacuum vessel; causing processing gas to be ejected toward the wafer from a plurality of gas ejection holes formed on the lower surface of an upper electrode provided within the vessel and disposed in parallel opposition to the lower electrode; improving, by means of a cover provided at the periphery of the upper and lower electrodes, the proportion of the ejected processing gas that reaches the semiconductor wafer; and applying a high-frequency voltage between the upper and lower electrodes, thereby generating plasma with which the semiconductor wafer is treated.

BRIEF DESCRIPTION OF THE DRAWINGS

FIG. 2 is a sectional view of a plasma treatment apparatus according to one embodiment of the present invention.

DETAILED DESCRIPTION OF THE PREFERRED EMBODIMENTS

Figure 1:
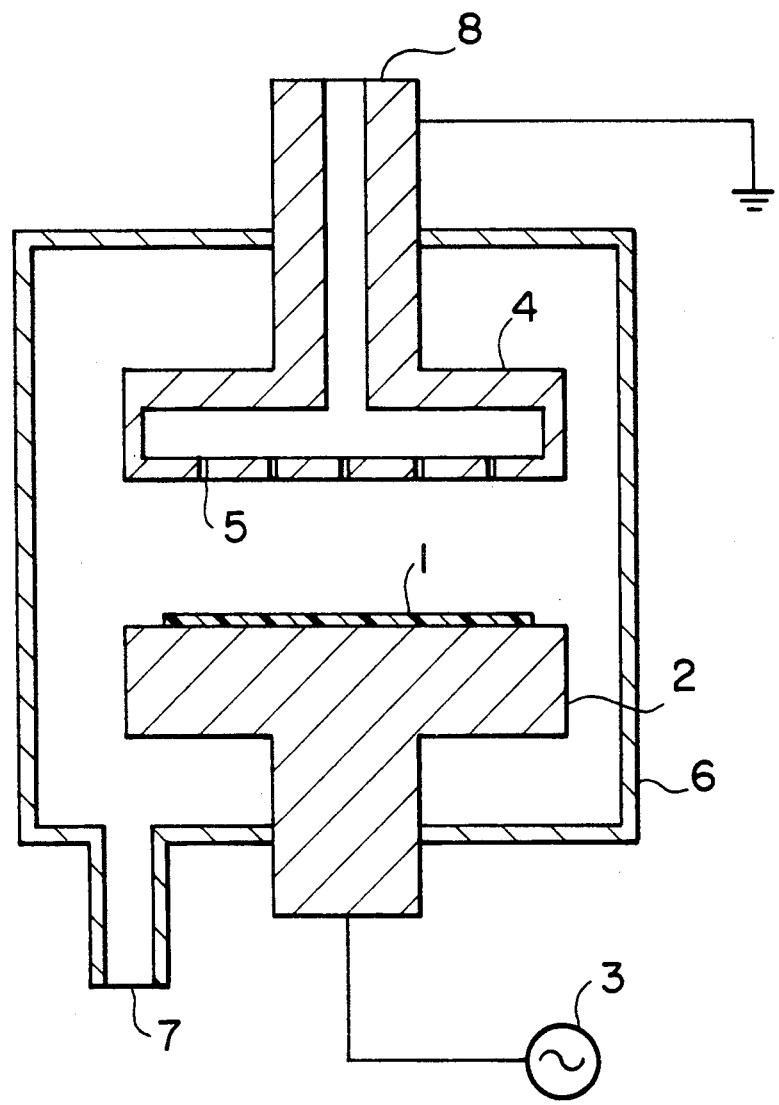
FIG. 1 is a sectional view of a conventional plasma treatment apparatus.

FIG. 2 shows, in section, a plasma treatment apparatus according to one embodiment of the present invention. In the drawing, reference numerals 1 to 8 designate component parts which are of exactly the same type as those in the above-described conventional apparatus for the plasma treatment of semiconductor devices. On the lower surface of the upper electrode 4, a cylindrical cover 9 is provided and extends from the surface. The cover 9 surrounds the space between the upper electrode 4 and the lower electrode 2 from the outer periphery of the space. The distal end, or the lower end, of the cover 9 is positioned below the surface of a semiconductor wafer 1 placed on the lower electrode 2. The material forming the cover 9 should preferably be inert and corrosion resistant so that it is not attacked by the processing gas. Suitable examples include quartz, a ceramic material, and Teflon.

The apparatus for the plasma treatment of semiconductor devices which has the above-described construction operates in the following manner. A semiconductor wafer 1 is placed on the lower electrode 2, and the interior of the vacuum vessel 6 is evacuated through the evacuation port 7. Subsequently, processing gas is introduced through the gas introduction port 8, and the gas is ejected toward the semiconductor wafer 1 from the gas ejection holes 5 formed on the lower surface of the upper electrode 4. Further, a high-frequency voltage is applied to the lower electrode 2 by the high-frequency source 3, thereby generating a plasma in the space between the lower and upper electrodes 2 and 4 so that the semiconductor wafer 1 is treated with the plasma.

Because the cover 9 is provided on the outer periphery of the inter-electrode space, the ejected processing gas evenly diffuses in the space between the upper and lower electrodes 4 and 2 without diffusing outside of the inter-electrode space, and it reaches the surface of the semiconductor wafer 1. Therefore, it is possible to improve the efficiency at which the semiconductor wafer 1 is processed as well as the evenness with which various portions of the surface of the wafer 1 are treated. After reaching the surface, the processing gas diffuses through the gap between the lower electrode 2 and the lower end of the cover 9 which is positioned below the surface of the wafer 1 to the space which is outside the inter-electrode space but within the vacuum vessel 6. Thereafter, the gas is discharged through the evacuation port 7 outside of the vessel 6.

Figure 3:
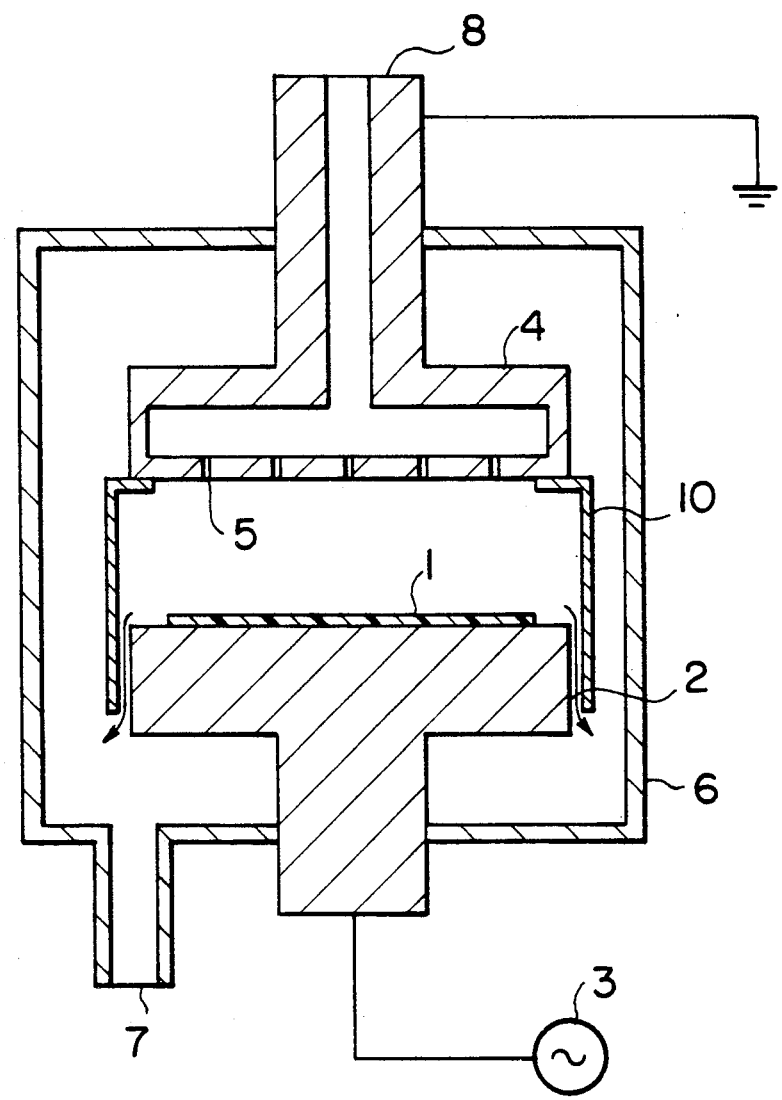
FIG. 3 is a sectional view of a plasma treatment apparatus according to another embodiment of the present invention.

So long as the lower end of the cover is positioned below the surface of the semiconductor wafer 1 placed on the lower electrode 2, the cover 9 of the above-described embodiment may be substituted by another cover. For instance, as shown in FIG. 3, a cover 10 which is considerably longer than the cover of FIG. 2 may be used.

We claim:

1. A method for the plasma treatment of a semiconductor wafer comprising:

placing a semiconductor wafer on a lower electrode provided within a vacuum vessel;

ejecting processing gas toward the wafer from a plurality of gas ejection holes in the lower surface of an upper electrode disposed within the vessel opposite the lower electrode;

providing a cover on the periphery of the upper electrode, extending toward the lower electrode, enclosing the wafer, and having a gap at the periphery of the lower electrode, thereby confining processing gas ejected from the gas ejection holes of the region between the upper and lower electrodes and limiting the flow of processing gas out of the region between the upper and lower electrodes to the gap at the periphery of lower electrode; and applying a high-frequency voltage between the upper and lower electrodes, thereby generating a plasma and treating the semiconductor wafer with the plasma.

* * * * *